United States Patent
Wei et al.

(10) Patent No.: US 9,666,610 B2
(45) Date of Patent: May 30, 2017

(54) ARRAY SUBSTRATE AND METHODS OF MANUFACTURING AND DRIVING THE SAME

(71) Applicants: BOE Technology Group Co., Ltd., Beijing (CN); Ordos Yuansheng Optoelectronics Co., Ltd., Inner Mongolia (CN)

(72) Inventors: Xiangdong Wei, Beijing (CN); Jing Liu, Beijing (CN); Xiang Feng, Beijing (CN); Yun Qiu, Beijing (CN)

(73) Assignees: BOE Technology Group Co., Ltd., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 14/744,265

(22) Filed: Jun. 19, 2015

(65) Prior Publication Data

US 2016/0284732 A1 Sep. 29, 2016

(30) Foreign Application Priority Data

Mar. 26, 2015 (CN) .......................... 2015 1 0137567

(51) Int. Cl.
*H01L 29/04* (2006.01)
*H01L 21/00* (2006.01)
(Continued)

(52) U.S. Cl.
CPC ...... *H01L 27/124* (2013.01); *G02F 1/134363* (2013.01); *G02F 1/136286* (2013.01);
(Continued)

(58) Field of Classification Search
CPC ... H01L 27/124; H01L 27/1259; H01L 43/10; G02F 1/133512; G02F 1/133514;
(Continued)

(56) References Cited

U.S. PATENT DOCUMENTS

| | | | |
|---|---|---|---|
| 8,599,349 B2 | 12/2013 | Chang et al. | |
| 2008/0129706 A1* | 6/2008 | Kim ...................... | G06F 3/0412 345/174 |

(Continued)

FOREIGN PATENT DOCUMENTS

| | | |
|---|---|---|
| CN | 102566162 A | 7/2012 |
| CN | 104022128 A | 9/2014 |
| CN | 104536630 A | 4/2015 |

OTHER PUBLICATIONS

First Office Action, including Search Report, for Chinese Patent Application No. 201510137567.8, dated Apr. 1, 2017, 14 pages.

*Primary Examiner* — Dzung Tran
(74) *Attorney, Agent, or Firm* — Westman, Champlin & Koehler, P.A.

(57) ABSTRACT

Embodiments of the present disclosure relate to the field of display technologies, and particularly, to an array substrate and methods of manufacturing and driving the same. With the embodiments of the present disclosure, undesirable phenomenon, e.g. color mixing and so on is avoid in a display device having the array substrate while simplifying the manufacture process of the array substrate. The array substrate comprises a substrate, thin-film transistors, pixel electrodes and a common electrode on the substrate, a plurality of leading wires and a color filter layer; wherein the common electrode comprises a plurality of common electrode blocks reusable as self-capacitance electrodes, and each of the leading wires has one end electrically connected to one of the common electrode blocks and the other end electrically connected to a touch integrated circuit. The array substrate according to the embodiments of the present disclosure is used in the display device.

7 Claims, 4 Drawing Sheets

(51) Int. Cl.
- *H01J 9/00* (2006.01)
- *C09K 19/02* (2006.01)
- *H01L 27/12* (2006.01)
- *G02F 1/1362* (2006.01)
- *G02F 1/1343* (2006.01)
- *G09G 3/36* (2006.01)

(52) U.S. Cl.
CPC ............ *G09G 3/36* (2013.01); *H01L 27/1259* (2013.01); *G02F 2001/134318* (2013.01); *G02F 2001/136222* (2013.01)

(58) Field of Classification Search
CPC ............. G02F 1/136286; G02F 1/1368; G02F 1/134363; G02F 2001/136222; G02F 2001/134318; G09G 3/36
USPC ........... 257/72; 438/26; 349/43, 173; 445/24
See application file for complete search history.

(56) References Cited

U.S. PATENT DOCUMENTS

| | | | |
|---|---|---|---|
| 2009/0268134 A1* | 10/2009 | Lee .................. | G02F 1/136286 349/110 |
| 2011/0122348 A1* | 5/2011 | Sakai ................. | G02F 1/13338 349/110 |
| 2012/0105347 A1* | 5/2012 | Pak ....................... | G06F 3/0412 345/173 |
| 2012/0249436 A1* | 10/2012 | Choi ................... | G02F 1/13338 345/173 |
| 2012/0313894 A1* | 12/2012 | Hotelling .......... | G02F 1/134363 345/174 |
| 2013/0229591 A1* | 9/2013 | Kong ................ | G02F 1/136209 349/46 |
| 2016/0259445 A1 | 9/2016 | Yang et al. | |
| 2016/0357283 A1 | 12/2016 | Xu et al. | |

* cited by examiner

FIG. 8

ARRAY SUBSTRATE AND METHODS OF MANUFACTURING AND DRIVING THE SAME

CROSS-REFERENCE TO RELATED APPLICATION

This application claims the benefit of Chinese Patent Application No. 201510137567.8 filed on Mar. 26, 2015 in the State Intellectual Property Office of China, the whole disclosure of which is incorporated herein by reference.

BACKGROUND OF THE DISCLOSURE

Technical Field

The present disclosure relates to the field of display technologies, and particularly, to an array substrate and methods of manufacturing and driving the same.

Description of the Related Art

Generally, a display device comprises a touch screen and a display panel including an array substrate and a color filter substrate, wherein touch electrodes in the display panel may be arranged on the array substrate in order to reduce a thickness of the display device.

Specifically, the array substrate has thin-film transistors, pixel electrodes, common electrodes and touch electrodes arranged thereon. The color filter substrate has a color filter layer, etc., arranged thereon, and the color filter layer includes a plurality of regions each corresponding to one pixel electrode of the array substrate. In case that self-capacitance is adopted as principle for detection of touch positions, the touch electrodes may comprise a plurality of self-capacitance electrodes arranged in the same layer but being insulated from each other. Here, the touch position is detected in accordance with changes of the capacitance values of the self-capacitance electrodes. Process for fabricating the display panel comprises steps of manufacturing the array substrate, manufacturing the color filter substrate, and assembling the array substrate to the color filter substrate, etc.

The inventors have found that, during fabrication of the array substrate, provisions of the self-capacitance electrodes results in additional manufacturing process of the array substrate, increasing the manufacturing cost of the display device. Moreover, during the assembling of the array substrate to the color filter substrate, deviation of the alignment between the pixel electrodes and the corresponding regions of the color filter layer leads to undesirable phenomenon, e.g. color mixing and so on, in the display device.

SUMMARY OF THE DISCLOSURE

According to a first aspect of the present disclosure, there is provided an array substrate comprising
  a substrate; and
  thin-film transistors, pixel electrodes and a common electrode on the substrate; and
  a plurality of leading wires and a color filter layer;
  wherein the common electrode comprises a plurality of common electrode blocks reusable as self-capacitance electrodes; and each of the leading wires has one end electrically connected to one of the common electrode blocks and the other end electrically connected to a touch integrated circuit.

According to a second aspect of the present disclosure, there is provided a method of manufacturing an array substrate, comprising:
  forming thin-film transistors, a color filter layer and pixel electrodes;
  forming a common electrode; and
  forming a plurality of leading wires;
  wherein the common electrode comprises a plurality of common electrode blocks reusable as self-capacitance electrodes; and each of the leading wires has one end electrically connected to one of the common electrode blocks and the other end electrically connected to a touch integrated circuit.

According to a third aspect of the present disclosure, there is provided a method of driving the abovementioned array substrate, comprising:
  using the leading wires, within a touch time period, to transmit touch signals between the touch integrated circuit and the common electrode blocks; and
  using the leading wires, within a display time period, to transmit a common voltage signal to the common electrode blocks.

BRIEF DESCRIPTION OF THE DRAWINGS

In order to clearly describe the technical solutions according to the embodiments of the present disclosure or those in the prior art, drawings used in describing the embodiments will be introduced briefly. Obviously, illustrated in these drawings are only some of embodiments of the present disclosure. For those skilled in the art, other drawings may be achieved by referring to the following drawings without involving any inventive steps.

REFERENCE NUMBERS

1—substrate; 2—thin-film transistor; 21—active layer; 22—gate insulation layer; 23—gate; 24—source-drain electrode insulation layer; 25—source electrode; 26—drain electrode; 3—pixel electrode; 4—common electrode; 41—common electrode block; 5—leading wire; 6—color filter layer; 7—passivation layer; 8—black matrix; and 9—buffer layer.

DETAILED DESCRIPTION OF THE EMBODIMENTS OF THE DISCLOSURE

In order to provide a more clear understanding of objects, technique solutions and advantages of the present disclosure, the present disclosure will be further described hereinafter in detail in conjunction with preferred embodiments and with reference to the attached drawings. Obviously, the described embodiments are only some of embodiments of the present disclosure. For those skilled in the art, other embodiments may be achieved by referring to the following embodiments without involving any inventive steps.

First Embodiment

Figure 1:
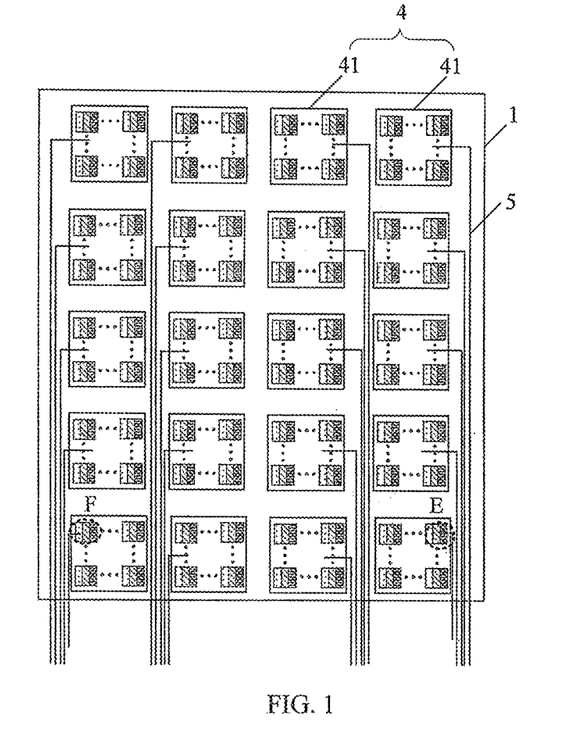
FIG. 1 is a schematic diagram of an array substrate according to an embodiment of the present disclosure.
Figure 2:
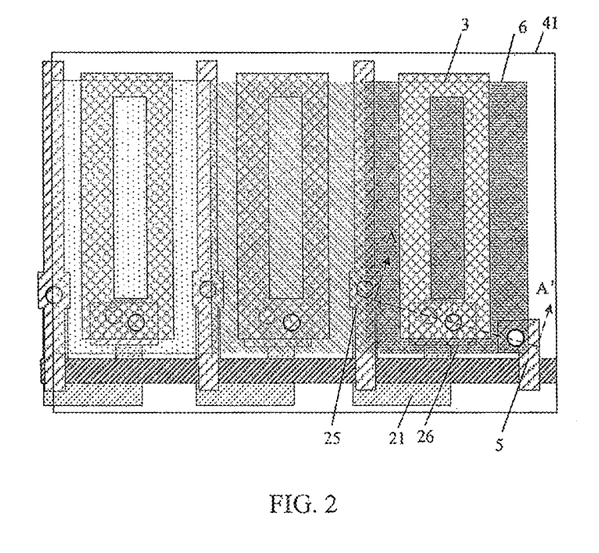
FIG. 2 is a schematic diagram of a region E shown in FIG. 1.
Figure 3:
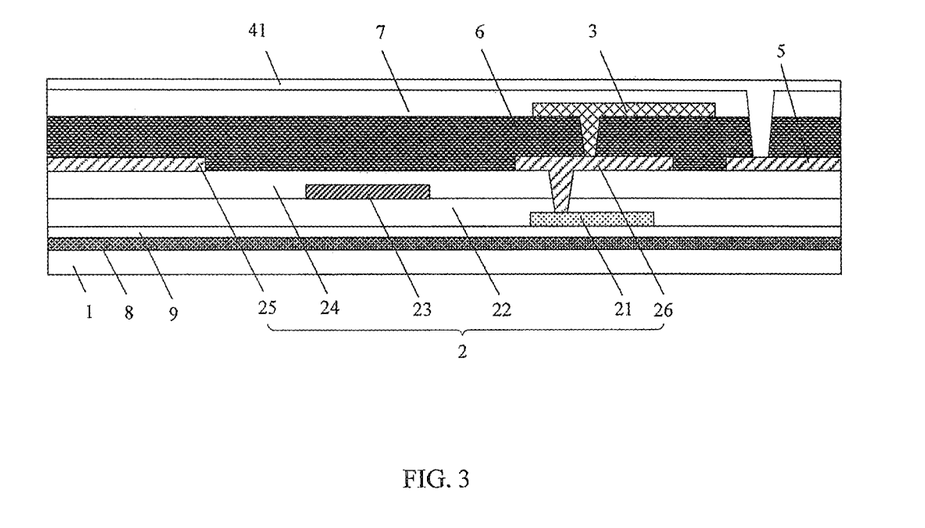
FIG. 3 is a sectional view along a line A-A' shown in FIG. 2.
Figure 4:
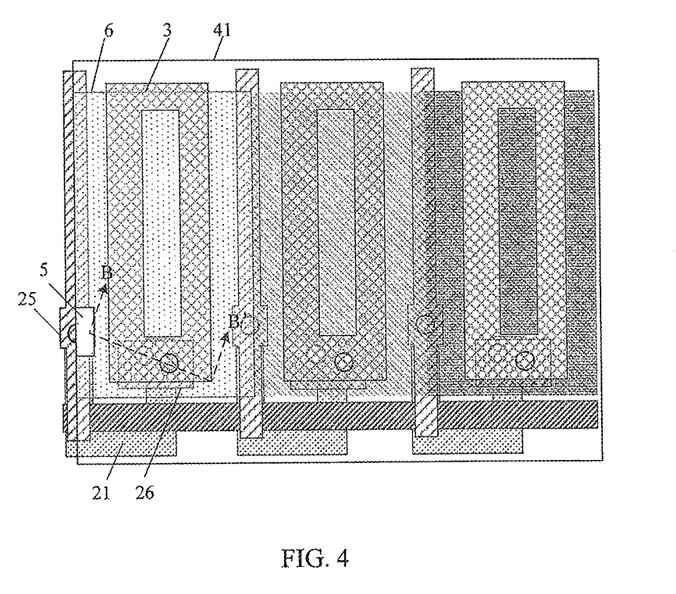
FIG. 4 is a schematic diagram of a region F shown in FIG. 1.

There is provided an array substrate according to this embodiment of the present disclosure. Referring to FIGS. 1-3, the array substrate comprises a substrate 1 and thin-film transistors 2, pixel electrodes 3 and a common electrode 4 on the substrate 1. Moreover, the array substrate further comprises a plurality of leading wires 5 and a color filter layer 6. The common electrode 4 comprises a plurality of common electrode blocks 41 reusable as self-capacitance electrodes, and each of the leading wires 5 has one end electrically connected to one of the common electrode blocks 41 and the other end electrically connected to a touch integrated circuit (not shown in Figures).

Since the common electrode blocks 41 are reusable as self-capacitance electrodes in the touch screen, no additional self-capacitance electrode is required to be manufactured on the array substrate, which simplifies the manufacture process of the array substrate. Moreover, because deviation of the alignment between the pixel electrodes 3 and the color filter layer 6 will not occur during the assembly, undesirable phenomenon, e.g. color mixing and so on, is avoid in the display device having the array substrate while simplify the manufacture process of the array substrate.

The number of the common electrode blocks 41 depends on size and resolution ratio of the display device. Exemplarily, referring to FIG. 1, there are twenty common electrode blocks 41 arranged in an array of four rows and five columns, the respective common electrode blocks 41 have the same shape and area, and, a projection of each of the common electrode blocks 41 on the substrate 1 is superposed with that of at least one pixel on the substrate 1. Of course, the respective common electrode blocks 41 may have different shapes and/or areas. The pixel may comprise adjacent regions of different colors in the color filter layer 6. Exemplarily, the color filter layer 6 may comprise a plurality of red regions, a plurality of green regions and a plurality of blue regions. Here, one pixel corresponds to three regions including one red region, one green region and one blue region adjacent to one another.

To facilitate a more clear understanding, construction and parts of the array substrate will be described hereinafter in detail by taking the array substrate shown in FIGS. 2-5 as an example.

Referring to FIG. 3, the thin-film transistor 2 is disposed on the substrate 1. The thin-film transistor 2 may be a bottom gate type thin-film transistor, or a top gate type thin-film transistor. In this embodiment, the thin-film transistor 2 is preferably a top gate type thin-film transistor. With this arrangement, no shift occurs in a threshold voltage of the thin-film transistor 2 during its application.

Figure 5:
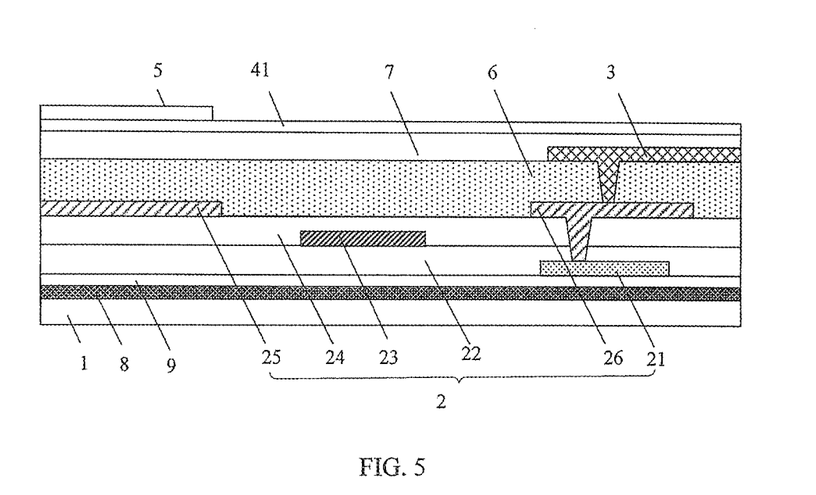
FIG. 5 is a sectional view along a line B-B' shown in FIG. 4.

More specifically, referring to FIGS. 3 and 5, the thin-film transistor 2 comprises an active layer 21, a gate insulation layer 22, a gate 23, a source-drain electrode insulation layer 24, a source electrode 25 and a drain electrode 26 arranged in sequence on the substrate 1. Via holes corresponding to the source electrode 25 are formed in both the gate insulation layer 22 and the source-drain electrode insulation layer 24, and the active layer 21 is connected with the source electrode 25 through the via holes corresponding to the source electrode 25. Moreover, via holes corresponding to the drain electrode 26 are formed in both the gate insulation layer 22 and the source-drain electrode insulation layer 24, and the active layer 21 is connected with the drain electrode 26 through the via holes corresponding to the drain electrode 26.

Exemplarily, the substrate 1 may be a glass substrate or quartz substrate, having good light transmission. The active layer 21 may be made of a material such as polycrystalline silicon, amorphous silicon, monocrystalline silicon, metal oxide semiconductor material, or the like. The gate insulation layer 22 and the source-drain electrode insulation layer 24 may be made of a material such as oxide, nitride or nitrogen oxide, or insulated resin materials. The gate 23, the source electrode 25 and the drain electrode 26 are made of one of, or an alloy consisted of two or more of, metals such as Cr, W, Ti, Ta, Mo, Al, Cu, and the like.

Moreover, the color filter layer 6 is located over the source electrode 25 and the drain electrode 26. Exemplarily, the color filter layer 6 comprises a plurality of red regions, a plurality of green regions and a plurality of blue regions. In addition, in order to improve a display brightness of the display device, the color filter layer 6 may further comprise a plurality of white regions. Materials for these regions are photosensitive resins with corresponding colors.

Moreover, the pixel electrode 3 is located on the color filter layer 6. Exemplarily, the pixel electrode 3 is formed with a slit, that is, there is provided a pixel electrode 3 having a slit. In addition, the pixel electrode 3 may be a strip electrode. Usually, the pixel electrode 3 is made of a transparent conductive material such as ITO, IZO or the like. The color filter layer 6 is provided therein with a via hole corresponding to the pixel electrode 3, and the drain electrode 26 is electrically connected with the pixel electrode 3 through the via hole.

Moreover, the array substrate further comprises a passivation layer 7 over the pixel electrode 3. The common electrode blocks 41 may be insulated from the pixel electrode 3. Usually, the passivation layer 7 may be made of a material such as oxide, nitride or nitrogen oxide, or insulated resin materials.

Moreover, the common electrode blocks 41 are located on the passivation layer 7. Exemplarily, materials for these common electrode blocks 41 are transparent conductive materials including ITO, IZO, etc.

Moreover, the leading wire 5 is located above the substrate 1. Exemplarily, there are two following cases for location of the leading wire 5.

In a first case, referring to FIG. 3, the leading wire 5, the source electrode 25 and the drain electrode 26 are arranged in the same layer. Since the leading wire 5, the source electrode 25 and the drain electrode 26 are formed simultaneously, the leading wire 5 does not need to be manufactured separately, simplifying the manufacturing process of the array substrate. In order to electrically connect the leading wire 5 with the of the common electrode block 41, via holes corresponding to the common electrode block 41 are provided in both the passivation layer 7 and the color filter layer 6, and the leading wire 5 is electrically connected with the common electrode block 41 through the via holes. Material for the leading wire 5 may be the same as those for the source electrode 25 and the drain electrode 26, that is, is one of, or an alloy consisted of two or more, of metals such as Cr, W, Ti, Ta, Mo, Al, Cu, etc. Of course, materials for the leading wire 5, the source electrode 25 and the drain electrode 26 may be transparent conductive materials including ITO, IZO, etc.

In a second case, referring to FIG. 5, one end of the leading wire 5 is located on the common electrode block 41 and is electrically connected with the common electrode block 41 directly. In order to ensure that provision of the leading wires 5 does not adversely affect dimension of the display area of the display device, materials for the leading wires 5 may be the same as those for the common electrode blocks 41, that is, be transparent conductive materials including ITO, IZO, etc.

In order to simplify the manufacturing process of the array substrate, in this embodiment, the leading wire 5 is located in the same layer as the source electrode 25 and the drain electrode 26. Moreover, the leading wire 5 may also be arranged at other locations of the array substrate, as long as it is electrically connected with the common electrode block 41. Exemplarily, one end of the leading wire 5 is located between the common electrode block 41 and the passivation layer 7 and is electrically connected with the common electrode block 41 directly, or, the leading wire 5 may also be arranged at other locations of the array substrate, and electrically connected with the common electrode block 41 through via hole (s).

Moreover, the array substrate may further comprise a black matrix 8 located on the substrate 1 directly. Exemplarily, projections of the leading wire 5 and the thin-film transistor 2 on the substrate 1 are within that of the black matrix 8 on the substrate 1. As a result, a narrow frame is obtained for the display device while not adversely affecting aperture opening ratio of the display device. Usually, the black matrix 8 is made of black resin having good light shading and non-reflection performances.

Moreover, the array substrate may further comprise a buffer layer 9 between the black matrix 8 and the active layer 21. Since the surface of the substrate 1 contains impurities thereon, this buffer layer 9 prevents impurities from spreading into the active layer 21 during the manufacture process of the active layer 21, avoiding adverse affection of the impurities on characteristics, e.g., threshold voltage, leakage current and so on, of the thin-film transistor 2.

It should be noted that, positional relationship among the abovementioned parts/constructions is not limited to this, provided that the common electrode 4 comprises a plurality of common electrode blocks 41 reusable as self-capacitance electrodes, and each of the leading wires 5 has one end electrically connected to a common electrode block 41 and the other end electrically connected to a touch integrated circuit. Exemplarily, the black matrix 8 may also be located on the pixel electrode 3. In addition, the abovementioned array substrate may comprise other constructions/parts in accordance with actual requirements. There is no limitation on this according to these embodiments of the present disclosure.

In addition, there is provided a display device according to embodiments of the present disclosure. The display device comprises the array substrate according to the abovementioned embodiments of the present disclosure. The display device further comprises a counter or opposed substrate. Exemplarily, the opposed substrate is a naked glass substrate without any other constructions/parts. After performing the processes including assembling and injection of liquid crystal, a liquid crystal display panel is obtained, for subsequent production of the display device. The abovementioned display device may be embodied as any products or parts having the display function, including electronic paper, mobile phone, tablet computer, TV, displayer, notebook computer, navigating instrument, and so on.

Second Embodiment

Figure 6:
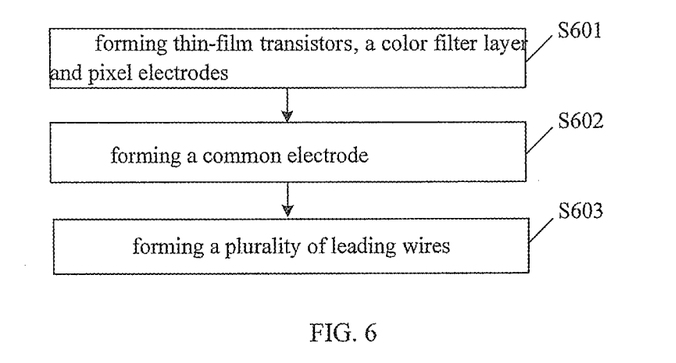
FIG. 6 is a flow diagram of a method for manufacturing an array substrate according to an embodiment of the present disclosure.

This embodiment provides a method for manufacturing the array substrate according to the first embodiment. Referring to FIG. 6, the method comprises:

step S601 of forming thin-film transistors, a color filter layer and pixel electrodes;

step S602 of forming a common electrode; and step S603 of forming a plurality of leading wires;

wherein the common electrode comprises a plurality of common electrode blocks reusable as self-capacitance electrodes; and each of the leading wires has one end electrically connected to one of the common electrode blocks and the other end electrically connected to a touch integrated circuit.

During manufacturing the common electrode blocks, a transparent conductive layer is formed by a process such as deposition, sputtering, coating or the like, and, is patterned to form a pattern including the common electrode blocks.

Since the common electrode blocks are reusable as self-capacitance electrodes in the touch screen, no additional self-capacitance electrode is required to be manufactured on the array substrate, which simplifies the manufacture process of the array substrate. Moreover, because deviation of the alignment between the pixel electrodes 3 and the color filter layer 6 will not occur during the assembly, undesirable phenomenon, e.g. color mixing and so on, is avoid in a display device having the array substrate while simplifying the manufacture process of the array substrate.

To facilitate a more clear understanding, the step S601 of forming the thin-film transistors, the color filter layer and the pixel electrodes will be described hereinafter in detail.

The step of forming the thin-film transistors comprises forming a pattern of an active layer on a substrate. Exemplarily, a semiconductor layer is formed on the substrate by processes including plasma chemical vapor deposition (PCVD) and so on, then photoresist is coated on the semiconductor layer, and the semiconductor layer coated with the photoresist is processed through processes including exposure, development, etching and the like by using a mask having a pattern for the active layer, so that the pattern of the active layer is obtained.

Moreover, the step of forming the thin-film transistors further comprises forming a gate insulation layer on the substrate fainted with the pattern of the active layer. Exemplarily, the gate insulation layer is formed on the substrate formed with the pattern of the active layer through processes including plasma chemical vapor deposition (PCVD), sputtering, thermal evaporation, or the like.

Moreover, the step of forming the thin-film transistors further comprises forming a pattern of gates on the substrate formed with the gate insulation layer. Exemplarily, a gate metal layer is formed on the substrate formed with the gate insulation layer by processes including plasma chemical vapor deposition (PCVD), sputtering, thermal evaporation, or the like, then photoresist is coated on the gate metal layer, and the gate metal layer coated with photoresist is processed through processes including exposure, development, etching and the like by using a mask having a pattern for the gate, so that the pattern of gates is obtained.

Moreover, the step of forming the thin-film transistors further comprises forming a source-drain electrode insulation layer on the substrate formed with the pattern of the gate. Exemplarily, a source-drain electrode insulation layer is formed on the substrate formed with the pattern of gates through a process such as plasma chemical vapor deposition (PCVD), sputtering, thermal evaporation, or the like. Then, via holes corresponding to the source electrode are formed in both the gate insulation layer and the source-drain electrode insulation layer by a patterning process, and the active layer is connected with the source electrode through the via holes corresponding to the source electrode. In addition, via holes corresponding to the drain electrode are formed in both the gate insulation layer and the source-drain electrode insulation layer, and the active layer is connected with the source electrode through the via holes corresponding to the drain electrode.

Moreover, the step of forming the thin-film transistors further comprises forming a pattern of source electrodes and drain electrodes on the substrate formed with the source-drain electrode insulation layer. Exemplarily, a source-drain metal layer is formed on the substrate formed with the source-drain electrode insulation layer by a process such as plasma chemical vapor deposition (PCVD), sputtering, thermal evaporation, or the like. Then, photoresist is coated on the source-drain metal layer, and the source-drain metal layer coated with the photoresist is processed through processes including exposure, development, etching and the like by using a mask having a pattern for the source electrode and the drain electrode, so that the pattern of source electrodes and drain electrodes is obtained.

Moreover, the method further comprises forming a color filter layer, namely, forming a color filter layer on the substrate formed with the thin-film transistors. Exemplarily, a color filter layer is formed on the substrate formed with the thin-film transistor by a process such as inkjet printing, pigment dispersion, printing, or the like. Exemplarily, if the color filter layer comprises a red region, a green region and a blue region, these regions will be formed in three steps. Exemplarily, the red region may be formed firstly. A layer of red photosensitive resin is coated on the substrate, and then is processed through processes including exposure, development, etching and the like by using a corresponding mask, so that the red region is obtained. Then the green region is formed. A layer of green photosensitive resin is coated on the substrate, and then is processed through processes including exposure, development, etching and the like by using a corresponding mask, so that the green region is obtained. Lastly, the blue region is formed. A layer of blue photosensitive resin is coated on the substrate, and then is processed through processes including exposure, development, etching and the like by using a corresponding mask, so that the blue region is obtained. With the above processes, the color filter layer is formed on the substrate formed with the thin-film transistor.

Moreover, the method further comprises forming pixel electrodes, namely, forming a pixel electrode layer on the substrate formed with the color filter layer and then forming a pattern of pixel electrodes by patterning the pixel electrode layer. Exemplarily, a transparent conductive layer is formed on the substrate formed with the color filter layer by a process such as deposition, sputtering, coating, or the like. Then photoresist is coated on the transparent conductive layer, and the transparent conductive layer coated with photoresist is processed through processes including exposure, development, etching and the like by using a mask having a pattern for the pixel electrode, so that the pattern of pixel electrodes is obtained.

In addition, the method of manufacturing the array substrate further comprises forming a passivation layer on the substrate formed with the pattern of pixel electrodes.

It should be noted that, the steps S601, S602 and S603 may be executed as follows: the step S603 is executed in the course of executing the step S601, and then the step S602 is executed; or, the step S601 is executed firstly, then the step S602 is executed, and finally the step S603 is executed. However, there may be other sequences of executing these steps, and there is no specific limitation on this.

Specifically, in one embodiment, the steps S601, S602 and S603 are executed as follows: the step S603 is executed in the course of executing the step S601, and then the step S602 is executed. That is, the leading wires are formed in the course of forming the thin-film transistors, the color filter layer and the pixel electrodes. Here, the step of forming the leading wires comprises forming the leading wires when forming the source electrodes and the drain electrodes, that is, forming a source-drain metal layer on the substrate formed with the source-drain electrode insulation layer, and then forming a pattern including the source electrodes, the drain electrodes and the leading wires by patterning the source-drain metal layer. Since the leading wires and the source and drain electrodes are formed simultaneously, the manufacture process of the array substrate is simplified.

In order to electrically connect the formed leading wires with the formed common electrode blocks, via holes corresponding to the common electrode block are formed in both the color filter layer and the passivation layer by a patterning process after forming the passivation layer on the substrate formed with the pattern of the pixel electrode, and the leading wire is electrically connected with its corresponding common electrode block through the via holes. Specifically, the via holes corresponding to the common electrode block may be formed by two times of etching process, comprising firstly etching the color filter layer after forming the color filter layer and then etching the passivation layer after forming the passivation layer. Or, the via holes may formed by executing one time of etching process on both the passivation layer and the color filter layer after forming the passivation layer. In these embodiments, the via holes corresponding to the common electrode block are formed by only executing one time of etching process, so the manufacture process of the array substrate is simplified.

Specifically, in another embodiment, the steps S601, S602 and S603 are executed as follows: the step S601 is executed firstly, then the step S602 is executed, and finally the step S603 is executed. That is, the leading wires are formed after forming the common electrode. Here, the method of forming the leading wires comprises forming a pattern including a plurality of leading wires on the substrate formed with the common electrode, wherein one end of each of the leading wires is located on a corresponding common electrode block and thus is electrically connected with the corresponding common electrode block directly.

In a preferably embodiment, the steps S601, S602 and S603 are executed as follows: the step S603 is executed in the course of executing the step S601, and then the step S602 is executed. Here, the leading wires and the source and drain electrodes are formed simultaneously, thus the manufacture process of the array substrate is simplified.

Moreover, the method of manufacturing the array substrate may further comprise forming a black matrix on the substrate. Exemplarily, a black matrix is formed directly on the substrate by a process including inkjet printing, pigment dispersion, printing, or the like. Exemplarily, a layer of black photosensitive resin is firstly coated on the substrate. Then, the layer of black photosensitive resin is processed through processes including exposure, development, etching and the like by using a mask having a pattern for the black matrix, thereby forming the black matrix on the substrate.

Moreover, the method of manufacturing the array substrate may further comprise forming a buffer layer on the substrate. Exemplarily, a buffer layer is formed on the substrate formed with the pattern of black matrix by processes including plasma chemical vapor deposition (PCVD) or the like.

Figure 7:
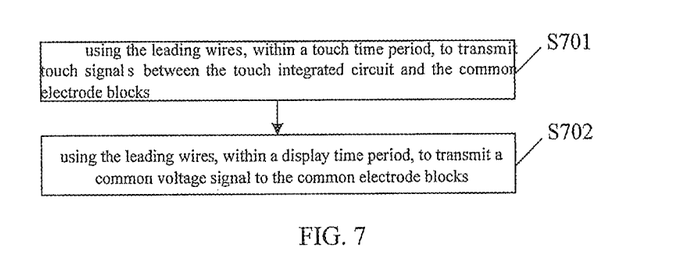
FIG. 7 is a flow diagram of a method for driving an array substrate according to an embodiment of the present disclosure.

In addition, there is provided a method for driving the array substrate according to the first embodiment. Referring to FIG. 7, the method comprises:

step S701 of using the leading wires, within a touch time period, to transmit touch signals between the touch integrated circuit and the common electrode blocks; and step S702 of using the leading wires, within a display time period, to transmit a common voltage signal to the common electrode blocks.

Exemplarily, the touch signals comprise touch scanning signals and touch sensing signals.

A period per frame for the touch screen is divided into the touch time period and the display time period, that is, a time-sharing drive method is applied for a touch phase and a display phase, reducing signal interference between the touch phase and the display phase. Exemplarily, referring to FIG. 8, the period per frame for the touch screen is divided into the display time period C and the touch time period T. Exemplarily, if the period per frame for the touch screen is 15.6 ms, then the display time period C is 11 ms and the touch time period T is 4.6 ms. Durations of the display time period C and the touch time period T depend on resolution ratio of the display device or on the processing ability of the chip. There is no specific limitation on this. Moreover, the drive chip for the display time period and the sensing chip for the touch time period may be the same one. Exemplarily, the drive chip for the display time period and the sensing chip for the touch time period are the chip used in the touch integrated circuit, thereby reducing manufacturing cost of the display device.

Figure 8:
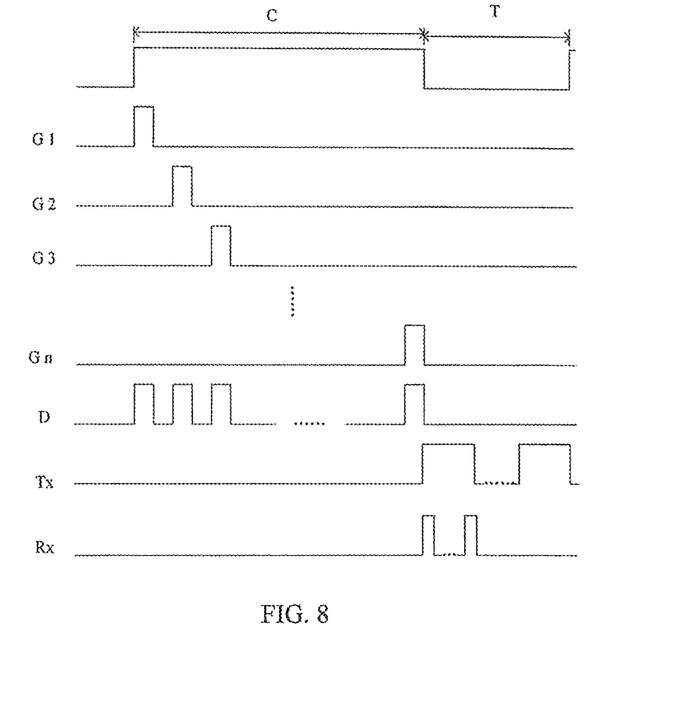
FIG. 8 is a flow diagram of timing sequences for driving an array substrate according to an embodiment of the present disclosure.

Exemplarily, referring to FIG. 8, within the display time period, respective gate lines of the touch screen are applied in sequence with gate scanning signals G1, G2, G3 . . . Gn; and the chip of the touch integrated circuit applies a common voltage signal to respective common electrode blocks, that is, it transmits the common voltage signal to respective common electrode blocks via the leading wires, thereby achieving the display function of the display device. Within the touch time period, the chip of the touch integrated circuit applies a touch scanning signal Tx to respective common electrode blocks while receiving touch sensing signals Rx from respective the common electrode blocks, that is, it transmits the touch signals between the touch integrated circuit and the common electrode blocks via the leading wires and judges if there is a touch operation based on the analysis on the touch sensing signal Rx, thereby achieving the touch function of the display device.

Purposes, technical solutions and advantageous effects of the present disclosure have been further illustrated in the above specific embodiments. It should be understood that the above description is merely used to illustrate specific embodiments of the present disclosure, but not to limit the present disclosure. All of changes, equivalent alternatives, improvements, made within principles and spirit of the disclosure, should be included within the scope of the present disclosure, and the scope of which is defined in the claims and their equivalents.

What is claimed is:

1. An array substrate, comprising:
a substrate; and
thin-film transistors, each comprising a source electrode and a drain electrode arranged in sequence on the substrate, pixel electrodes and a common electrode on the substrate; and
a plurality of leading wires and a color filter layer;
wherein the common electrode comprises a plurality of common electrode blocks reusable as self-capacitance electrodes; and each of the leading wires has one end electrically connected to one of the common electrode blocks and the other end electrically connected to a touch integrated circuit;
wherein the leading wires are arranged in the same layer as the source electrode and the drain electrode.

2. The array substrate of claim 1, wherein the respective common electrode blocks have the same shape and area, and, a projection of each of the common electrode blocks on the substrate is superposed with that of at least one pixel on the substrate.

3. The array substrate of claim 1, wherein each thin-film transistor comprises an active layer, a gate insulation layer, a gate, a source-drain electrode insulation layer, the source electrode and the drain electrode arranged in sequence on the substrate; and
the color filter layer is located over the source electrode and the drain electrode; and
the pixel electrode is located on the color filter layer.

4. The array substrate of claim 3, wherein the array substrate further comprises a passivation layer on the pixel electrode; and
the common electrode blocks are located on the passivation layer.

5. The array substrate of claim 4, wherein
the passivation layer and the color filter layer each is provided therein with via holes corresponding to the respective common electrode blocks, and each leading wire is electrically connected with its corresponding common electrode block via the via holes.

6. The array substrate of claim 3, wherein the one end of each of the leading wires is located on a corresponding common electrode block and is electrically connected with the corresponding common electrode block directly.

7. The array substrate of claim 3, wherein the array substrate further comprises a black matrix on the substrate, and projections of the leading wires and the thin-film transistors on the substrate are within that of the black matrix on the substrate.

* * * * *